(12) United States Patent
Cho

(10) Patent No.: US 9,035,326 B2
(45) Date of Patent: May 19, 2015

(54) LIGHT EMITTING MODULE

(75) Inventor: Yun Min Cho, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 463 days.

(21) Appl. No.: 13/242,915

(22) Filed: Sep. 23, 2011

(65) Prior Publication Data

US 2012/0007076 A1 Jan. 12, 2012

(30) Foreign Application Priority Data

Oct. 27, 2010 (KR) .................. 10-2010-0105527
Oct. 27, 2010 (KR) .................. 10-2010-0105528
Oct. 27, 2010 (KR) .................. 10-2010-0105529

(51) Int. Cl.

| H01L 33/00 | (2010.01) |
|---|---|
| H05K 1/02 | (2006.01) |
| F21S 8/10 | (2006.01) |
| F21V 19/00 | (2006.01) |
| F21Y 101/02 | (2006.01) |
| F21Y 103/00 | (2006.01) |
| H01L 25/16 | (2006.01) |
| H01L 33/52 | (2010.01) |
| H01L 33/58 | (2010.01) |
| H01L 33/64 | (2010.01) |

(Continued)

(52) U.S. Cl.
CPC .............. *H05K 1/0203* (2013.01); *F21S 48/115* (2013.01); *F21V 19/003* (2013.01); *F21Y 2101/02* (2013.01); *F21Y 2103/003* (2013.01); *H01L 25/167* (2013.01); *H01L 33/52* (2013.01); *H01L 33/58* (2013.01); *H01L 33/641* (2013.01); *H01L 33/642* (2013.01); *H05K 1/05* (2013.01); *H05K 3/284* (2013.01); *H05K 2201/09745* (2013.01); *H05K 2201/10106* (2013.01); *H05K 2201/2018* (2013.01); *F21S 48/1109* (2013.01); *F21S 48/321* (2013.01); *H01L 2224/48091* (2013.01)

(58) Field of Classification Search
USPC ................. 257/81, 82, 84, 88, 91, 93, 95, 99, 257/E33.005, E33.056, E33.057, E33.058, 257/E33.075; 438/26, 28, 29, 34
See application file for complete search history.

(56) References Cited

U.S. PATENT DOCUMENTS

| 7,709,292 B2 * | 5/2010 | Sadwick et al. .............. 438/107 |
|---|---|---|
| 2002/0000563 A1 * | 1/2002 | Udagawa ......................... 257/94 |
| 2006/0001361 A1 | 1/2006 | Imai et al. |

(Continued)

FOREIGN PATENT DOCUMENTS

| JP | 2006-253288 | 9/2006 |
|---|---|---|
| JP | 2007-324547 | 12/2007 |

(Continued)

OTHER PUBLICATIONS

European Search Report for EP11182413 dated Feb. 2, 2012.

*Primary Examiner* — Su C Kim
(74) *Attorney, Agent, or Firm* — Lowe Hauptman & Ham, LLP

(57) ABSTRACT

Disclosed is a light emitting module capable of representing improved heat radiation and improved light collection. there is provided a light emitting module. The light emitting module includes a metallic circuit board formed therein with a cavity, and a light emitting device package including a nitride insulating substrate attached in the cavity of the metallic circuit board, at least one pad part on the nitride insulating substrate, and at least one light emitting device attached on the pad part.

25 Claims, 11 Drawing Sheets

(51) Int. Cl.
*H05K 1/05* (2006.01)
*H05K 3/28* (2006.01)

(56) References Cited

U.S. PATENT DOCUMENTS

| | | | |
|---|---|---|---|
| 2007/0007558 A1 | 1/2007 | Mazzochette | |
| 2008/0006837 A1* | 1/2008 | Park et al. | 257/98 |
| 2008/0061717 A1 | 3/2008 | Bogner et al. | |
| 2008/0296761 A1* | 12/2008 | Lee et al. | 257/737 |
| 2009/0146584 A1* | 6/2009 | Ye et al. | 315/294 |
| 2009/0219728 A1 | 9/2009 | Hata et al. | |
| 2009/0261356 A1* | 10/2009 | Lee et al. | 257/88 |
| 2010/0066253 A1 | 3/2010 | Hying et al. | |
| 2010/0181891 A1* | 7/2010 | Lee et al. | 313/46 |
| 2010/0193822 A1* | 8/2010 | Inobe et al. | 257/98 |
| 2010/0314643 A1* | 12/2010 | Lin | 257/98 |
| 2011/0101394 A1* | 5/2011 | McKenzie et al. | 257/98 |
| 2012/0015462 A1* | 1/2012 | Lai et al. | 438/26 |

FOREIGN PATENT DOCUMENTS

| | | |
|---|---|---|
| JP | 2008-258413 | 10/2008 |
| JP | 2009-533860 | 9/2009 |
| KR | 10-2005-0005688 | 1/2005 |
| KR | 10-2005-0081715 | 8/2005 |
| KR | 10-2005-0102395 | 10/2005 |
| KR | 10-2007-0031758 | 3/2007 |
| KR | 10-2007-0078309 | 7/2007 |
| KR | 10-2007-0118389 | 12/2007 |
| KR | 10-2009-0099047 | 9/2009 |
| WO | 2009/060219 | 5/2009 |

* cited by examiner (a)   (b)   (c)   (d)

LIGHT EMITTING MODULE

CROSS REFERENCE TO RELATED APPLICATION

This application claims the priority of Korean Patent Application No. 10-2010-0105527, filed on Oct. 27, 2010, and Korean Patent Application No. 10-2010-0105528, filed on Oct. 27, 2010, and Korean Patent Application No. 10-2010-0105529, filed on Oct. 27, 2010 in the KIPO (Korean Intellectual Property Office), the disclosure of which are incorporated herein in their entirety by reference.

BACKGROUND

The embodiment relates to a light emitting module.

In general, a circuit board is obtained by forming a circuit pattern on an electrical insulating substrate by using a conductive material such as copper, and refers to a substrate before a heat emitting device related to electronic components is mounted thereon. The circuit board is provided thereon with a semiconductor device and a heat emitting device such as an LED (Light Emitting Diode).

In particular, the circuit board having the LED mounted thereon has been developed for a head lamp of a vehicle, so that heat resistance and a thermal transfer characteristic have been required.

However, the device such as the LED emits a significant amount of heat. If the circuit board having the LED does not deal with the heat, the temperature of the circuit board equipped with the heat emitting device is increased, so that the heat emitting device may not operate or erroneously operate. Accordingly, the reliability for products may be degraded.

SUMMARY

The embodiment provides a light emitting module used for a head lamp of a vehicle and having a novel structure.

The embodiment provides a light emitting module including a light emitting device package installed in a cavity of a circuit board.

The embodiment provides a light emitting module capable of representing improved heat radiation and improved light collection.

According to the embodiment, there is provided a light emitting module. The light emitting module includes a metallic circuit board formed therein with a cavity, and a light emitting device package including a nitride insulating substrate attached in the cavity of the metallic circuit board, at least one pad part on the nitride insulating substrate, and at least one light emitting device attached on the pad part.

According to the embodiment, the light emitting device package is directly installed in the cavity of the metallic circuit board, so that the heat radiation efficiency of the light emitting device package can be improved. Accordingly, the reliability for a device may be ensured.

According to the embodiment, lights can be collected in a light emission direction by forming the guide protrusion and the solder resist on the circuit board with a color representing low transmittance.

According to the embodiment, the pad part of the light emitting device package is provided in the form of a thin film through a sputtering process, so that a micro-circuit can be realized.

In addition, according to the embodiment, a molding part is formed between the light emitting device package and the light guide protrusion, thereby correcting a color temperature, and the molding part is provided in the form of a lens, thereby enhancing light collection of lights.

DETAILED DESCRIPTION OF THE EMBODIMENTS

Figure 1:
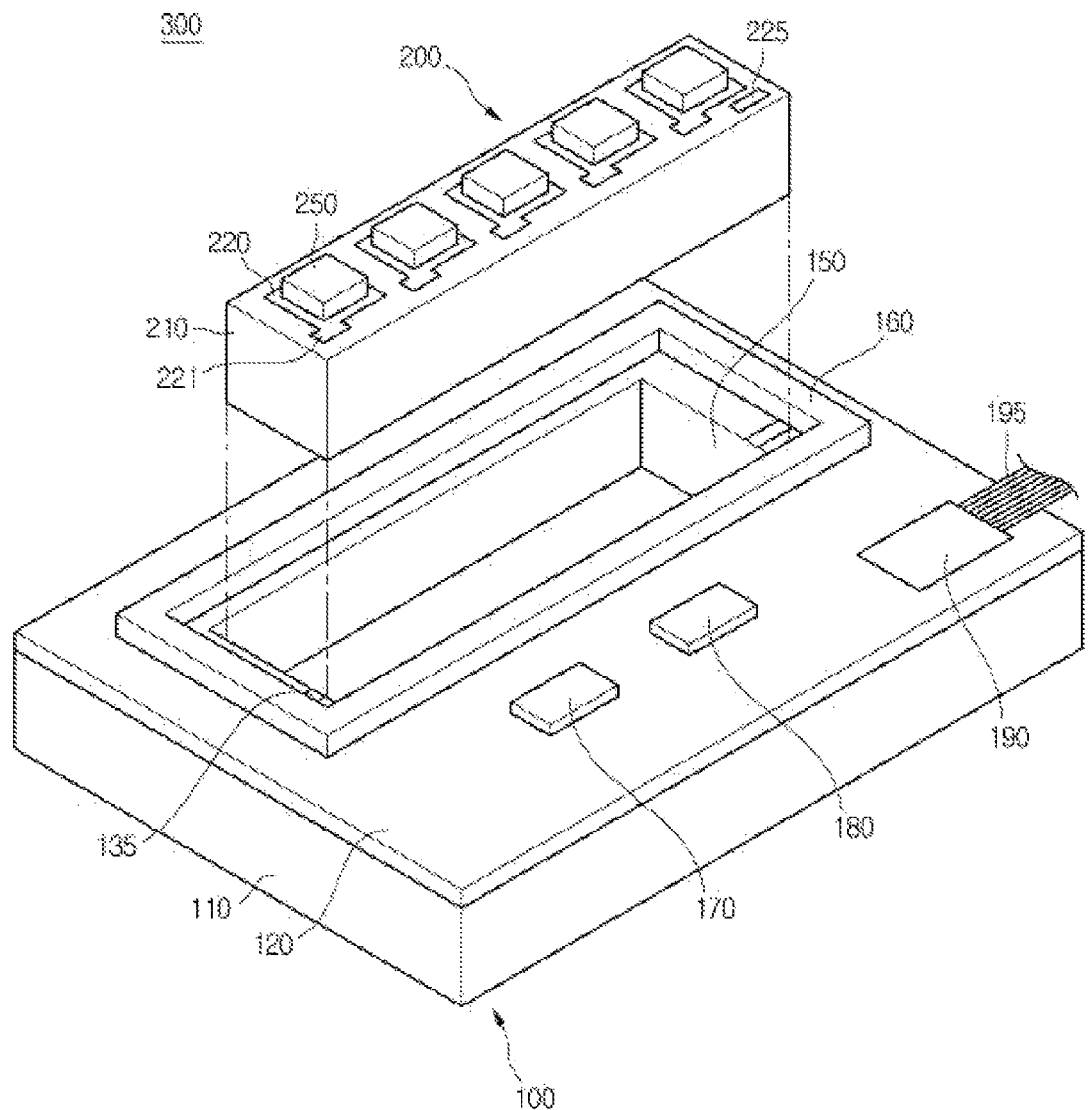
FIG. 1 is an exploded perspective view showing a light emitting module according to a first embodiment.

Hereinafter, embodiments will be described in detail with reference to accompanying drawings so that those skilled in the art can easily work with the embodiments. However, the embodiments may have various modifications. In accompanying drawings, parts that are not related to the description are omitted in order to make the embodiments clear. The similar reference numerals will be assigned to the similar components in the following description.

In the following description, when a predetermined part "includes" a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size.

In the description of the embodiments, it will be understood that, when a layer (or film), a region, or a plate is referred to as being "on" or "under" another layer (or film), another region, or another plate, it can be "directly" or "indirectly" on the other layer (or film), region, plate, or one or more intervening layers may also be present. Such a position of the layer has been described with reference to the drawings.

Hereinafter, a light emitting module according to a first embodiment will be described with reference to FIGS. 1 to 7.

Figure 2:
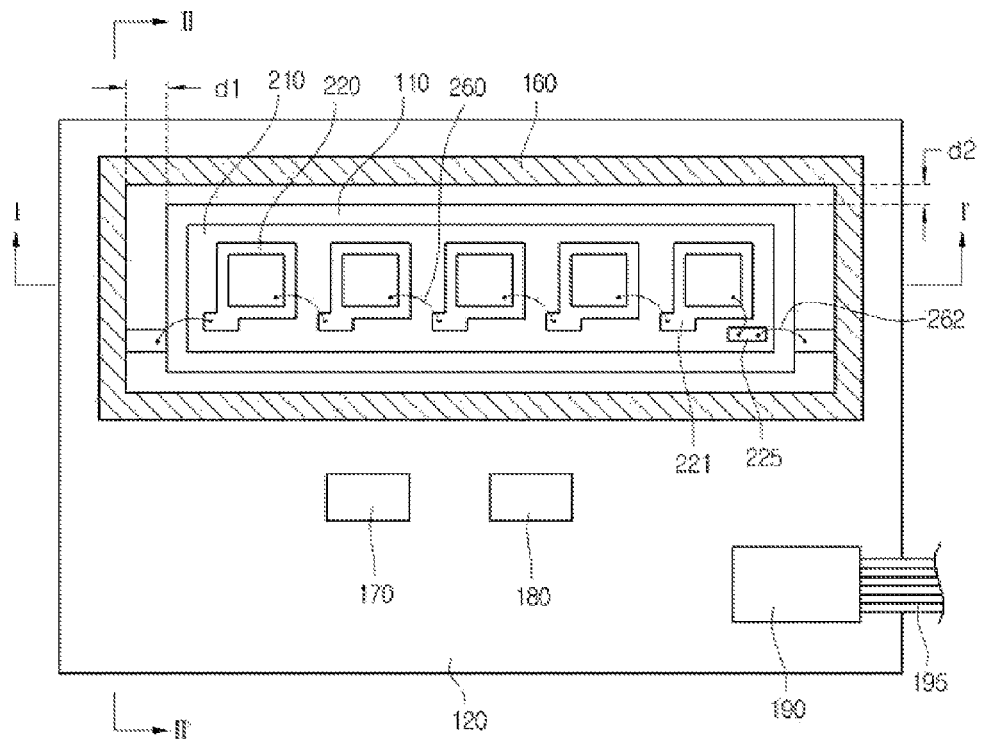
FIG. 2 is a top view showing the coupling of the light emitting module according to the first embodiment.
Figure 3:
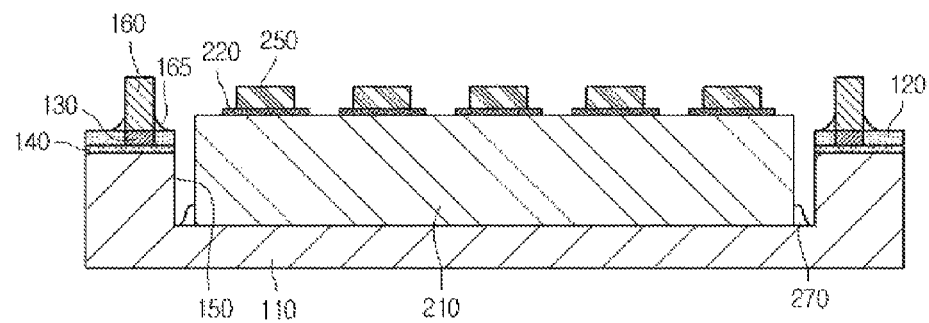
FIG. 3 is a sectional view showing the light emitting module of FIG. 2 taken along line I-I'.
Figure 4:
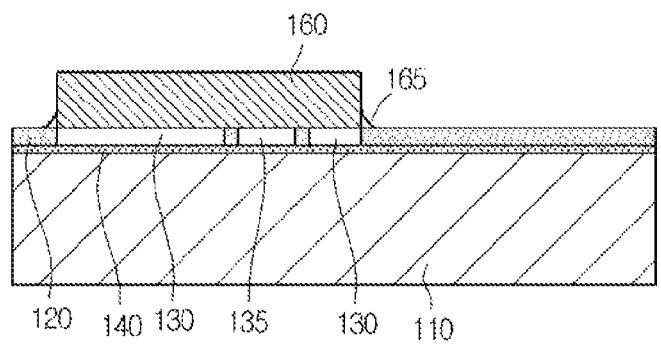
FIG. 4 is a sectional view showing a light emitting module of FIG. 2 taken along line II-II'.
Figure 5:
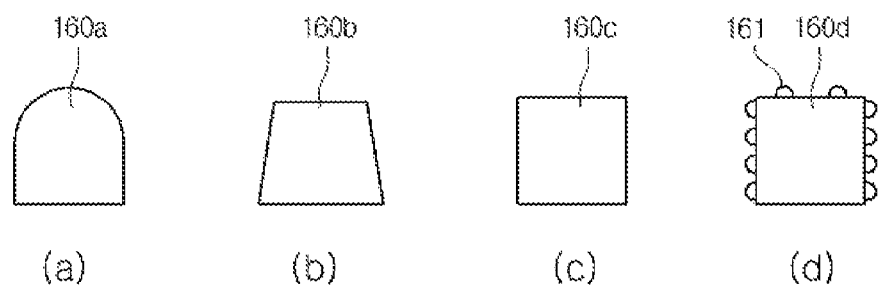
FIGS. 5A to 5D are side sectional views showing various applications of a guide protrusion shown in FIG. 4.

FIG. 1 is an exploded perspective view showing a light emitting module 300 according to the first embodiment, and FIG. 2 is a plan view showing the coupling of the light emitting module 300 according to the first embodiment. FIG. 3 is a sectional view showing the light emitting module 300 of FIG. 2 taken along line I-I', and FIG. 4 is a sectional view showing the light emitting module 300 of FIG. 2 taken along line II-II'. FIGS. 5A to 5D are side sectional views showing various applications of a guide protrusion shown in FIG. 4.

Referring to FIGS. 1 to 4, the light emitting module 300 includes a circuit board 100 and a light emitting device package 200 provided in a cavity 150 of the circuit board 100.

The light emitting module 300 has a structure in which the light emitting device package 200 is installed in the cavity 150 of the circuit board 100. In the light emitting device package 200, a plurality of light emitting devices 250 may be arranged on a substrate 210 in at least one row, and may be connected to each other in series or in parallel. Such a technical characteristic may be modified within the technical scope of the embodiment.

The circuit board 100 includes a metallic plate 110, an insulating layer 140, and a guide pattern 130 and a pad 135 connected to a plurality of circuit patterns.

The metallic plate 110 includes a heat sink plate representing high thermal conductivity, and may include an alloy of copper (Cu), aluminum (Al), silver (Ag), or gold (Au). Preferably, the metallic plate 110 may include the alloy of Cu.

The metallic plate 110 has a rectangular parallelepiped shape similar to a long rod with a longer length in a longitudinal direction, and is provided therein with the cavity 150 having a predetermined depth from a top surface of the metallic plate 110.

The metallic plate 110 may have a cylindrical shape other than the rectangular parallelepiped shape, but the embodiment is not limited thereto.

The cavity 150 is an installation part to install the light emitting device package 200 therein, and may have an area wider than that of the light emitting device package 200.

In this case, the metallic plate 110 may have a thickness of about 1000 μm or more, and the cavity 150 may have a depth of about 300 μm or more.

The insulating layer 140 is formed on a top surface of the metallic plate 110 such that the cavity 150 can be exposed through the insulating layer 140.

The insulating layer 140 may include a plurality of insulating layers, and a portion of the insulating layers may serve as an adhesive layer to bond the metallic plate 110 with a metallic layer such as a copper foil layer serving as a mother body for the guide pattern 130 and the pad 135.

The insulating layer 140 may include an epoxy-based resin or a polyimide-based resin, and solid components such as fillers or glass fiber may be distributed into the insulating layer 140. In addition, the insulating layer 140 may include an inorganic material such as an oxide or a nitride.

The insulating layer 140 is provided thereon with a plurality of guide patterns 130 and a plurality of pads 135.

The guide pattern 130 and the pad 135 may be formed by etching the copper foil layer and may include the alloy of Cu.

The surface of the pad 135 connected with the circuit pattern (not shown) may be treated with alloy of nickel (Ni), silver (Ag), gold (Au), or palladium (Pd).

The insulating layer 140 is provided thereon with a solder resist 120 such that the circuit pattern can be buried in the solder resist and the guide pattern 130 and the pad 135 can be exposed through the solder resist 120.

The solder resist 120 is coated with on the whole surface of the circuit board 100 and is dark-colored to represent low transmittance and low reflectance, so that the light collection can be improved by absorbing scattered lights. For example, the solder resist 120 may have a black color.

Meanwhile, the pad 135 and the guide pattern 130 may be electrically isolated from each other by the solder resist 120 as shown in FIG. 4.

In detail, the guide pattern 130 surrounds the cavity 150, and is spaced apart from the cavity 150 by predetermined distances d1 and d2.

The pad 135 is bonded to the light emitting device package 200 installed in the cavity 150 through a wire 262, and is exposed within the distances d1 and d2 between the cavity 150 and the guide pattern 130. Accordingly, the guide pattern 130 is separated from a region for the pad 135.

In this case, in the distances d1 and d2 between the guide pattern 130 and the cavity 150, the distance d1 from a first side with the pad 135 may differ from the distance d2 from a second side without the pad 135.

The distance d1 from the first side with the pad 135 may be greater than the distance d2 from the second side without the pad 135.

The guide patterns 130 are provided thereon with guide protrusions 160 surrounding the cavity 150.

The guide protrusions 160 connect the two guide patterns 130, which are separated from each other, to each other to form a closed loop.

The guide protrusions 160 may include an insulating inorganic material, and include a non-transmissive material. Preferably, the guide protrusions 160 may include a non-transmissive material such as a bulk aluminum oxide, and may have a height of about 800 μm. The guide protrusion 160 has a structure to collect lights emitted from the light emitting device package 200, and serves as a light absorbing layer to absorb scattered lights.

The guide protrusion 160 may have a curved side sectional surface 160a as shown in FIG. 5A, or may have a trapezoidal side sectional surface 160b as shown in FIG. 5B. If the guide protrusion 160 has the trapezoidal side sectional surface 160b, the area of the top surface of the trapezoidal side sectional surface 160b may be less than the area of the bottom surface thereof. In addition, the guide protrusion 160 may have a rectangular side sectional surface 160c as shown in FIGS. 5C and 3.

Meanwhile, the guide protrusions 160 may have the rectangular side sectional surface 160d as shown in FIG. 5d, and a plurality of convex patterns 161 may be formed on the surface of the guide protrusions 160. The convex patterns 161 may be irregular in a pattern size and a pattern arrangement. The convex patterns 161 may be formed on the whole surface of the guide protrusion 160, or may be formed only on the internal lateral surfaces of the guide protrusion 160 facing the cavity 150.

The convex patterns 161 may be formed on the guide protrusion 160 having the convex side sectional surface 160a or the trapezoidal side sectional surface 160b as shown in FIGS. 5A to 5B.

The guide protrusion 160 may be bonded to the solder resist 120 through a bonding layer 165. The bonding layer 165 supports the lateral surface of the guide protrusion 160 and is bonded to the solder resist 120. The bonding layer 165 may be formed by coating adhesive paste including a silicon oxide and sintering the adhesive paste.

Meanwhile, a zener diode 170 and a temperature sensor 180 are formed on the solder resist 120 formed on the top surface of the metallic plate 110.

The zener diode 170 is connected to the light emitting device 250 of the light emitting device package 200 in parallel, thereby preventing an inverse voltage from being applied to the light emitting device package 200.

The temperature sensor 180 may be a thermistor serving as a variable resistor having resistance varying according to the temperatures. Preferably, the temperature sensor 180 may be an NTC (negative temperature coefficient) thermistor in which resistivity is reduced with the increase of the temperature. The temperature sensor 180 receives a current from a terminal different from that of the zener diode 170 to change resistance according to heat emitted from the light emitting device 250, so that a changed output current flows.

A connector 190 is formed on an edge region of the top surface of the metallic plate 110 so that a current flows to the zener diode 170 and the temperature sensor 180.

The connector 190 has one end connected with a plurality of wires 195 to receive external signals, and an opposite end connected with the circuit pattern of the circuit board 100, so that a current flows to the zener diode 170, the temperature sensor 180, and the light emitting device package 200.

In this case, the temperature sensor 180 may be formed closely to the cavity 150 provided therein with the light emitting device package 200, and the distance from the cavity 150 to the temperature sensor 180 may be about 5 mm or less.

Meanwhile, the light emitting device package 200 is attached to the inside of the cavity 150 of the circuit board 100.

Hereinafter, the light emitting device package 200 will be described in detail with reference to FIGS. 6 and 7.

Figure 6:
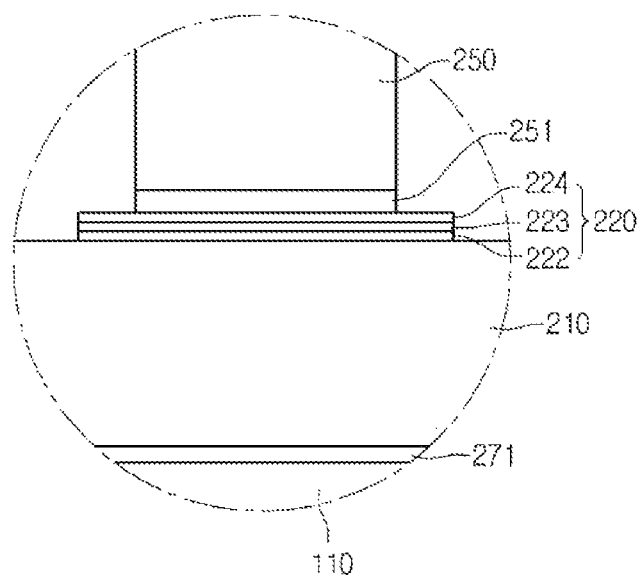
FIG. 6 is an enlarged view showing a light emitting module of FIG. 3.
Figure 7:
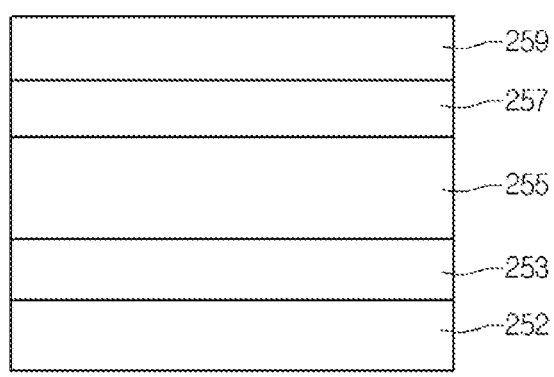
FIG. 7 is a detailed sectional surface showing a light emitting device constituting the light emitting module of FIG. 3.

FIG. 6 is an enlarged view showing the light emitting module of FIG. 3, and FIG. 7 is a detailed sectional surface showing a light emitting device constituting the light emitting module of FIG. 3.

A light emitting device package 200 includes an insulating substrate 210, a plurality of pad parts 220 formed on the insulating substrate 210, and a plurality of light emitting devices 250 attached to the pad parts 220.

The insulating substrate 210 has a rectangular parallelepiped shape having a sectional area equal to or smaller than a bottom surface of the cavity 150 so that the insulating substrate 210 can be installed in the cavity 150.

The insulating substrate 210 includes a nitride substrate representing high thermal conductivity, preferably, an aluminum nitride substrate. The insulating substrate 210 may have thermal conductivity of 170 Kcal/m·h·° C. or more. The nitride insulating substrate 210 may have a thickness of about 300 μm or more, preferably, a thickness of about 350 μm or more. The nitride insulating substrate 210 has a thickness greater than the depth of the cavity 150, so that the nitride insulating substrate 210 may protrude out of the cavity 150.

The insulating substrate 210 is bonded to the cavity 150 by a bonding paste 271 coated on the bottom surface of the cavity 150 and representing high thermal conductivity as shown in FIG. 6. The bonding paste 271 may include a conductive paste including AuSn.

The bonding paste 217 is thinly spread on the bottom surface of the insulating substrate 210 by heat and pressure, and a fillet 270 is formed to surround a portion of the lateral surface of the insulating substrate 210 to support the insulating substrate 210.

As described above, the insulating substrate 210 representing high thermal conductivity is directly attached to the metallic plate 110 of the circuit board 100, so that heat radiation can be ensured.

Meanwhile, the pad parts 220 are formed on the top surface of the insulating substrate 210.

The pad parts 220 are arranged while forming rows according to the arrangement of the light emitting device 250.

The number of the pad parts 220 is identical to the number of the light emitting devices 250. When five light emitting devices 250 are provided in one row in the light emitting device package 200 as shown in FIGS. 1 to 4, five pad parts 220 are provided in one row.

The pad part 220 includes an electrode region to which the light emitting device 250 is attached and a connection region 221 bonded to an adjacent light emitting device 250 or the pad 135 of the circuit board 100 through a wire.

The electrode region has a rectangular shape according to the shape of the area of the light emitting device 250, and the connection region 221 extends from the electrode region to protrude toward the pad part 220.

Although FIGS. 1 and 2 show that the connection region 221 has a rectangular shape, the connection region 221 may have patterns having various shapes according to another embodiment.

Light emitting devices 250 are attached to the electrode regions of the pad parts 220, respectively. An attachment layer 251 (as shown in FIG. 6, for example) is disposed between the light emitting device 250 and the electrode region of the pad part 220 such that the light emitting device 250 is attached to the electrode region of the pad part 220

The light emitting device 250 may include a vertical-type light emitting diode. One end of the light emitting device 250 may be attached to the pad part 220, and an opposite end of the light emitting device 250 may be connected to the connection region 221 of the adjacent pad part 220 through a wire 260 in series.

As described above, when a plurality of light emitting devices 250 are connected in series, the connection region 221 of the pad part 220 provided in the first column is connected to the pad part 135 of the adjacent circuit board 100 through the wire 262.

In this case, the light emitting device package 200 is provided on the top surface thereof with a pad island 225 adjacent to the pad part 220 attached to the last light emitting device 250 and including only the connection region 221.

The pad island 225 is connected to the light emitting device 250 of the adjacent pad part 220 through the wire 260, and connected to the pad 135 of the adjacent circuit board 100 through the wire 262.

The pad part 220 and the pad island 225 are provided toward the zener diode 170 and the temperature sensor 180 so that the connection regions 221 are close to the pad 135 of the circuit board 100.

The pad part 220 and the pad island 225 include a plurality of metallic layers 222, 223, and 224 as shown in FIG. 6.

The pad part 220 and the pad island 225 have a stack structure of first, second, and third metallic layers 222, 223, and 224, and each of the first to third metallic layers 222, 223, and 224 may include the alloy including titanium (Ti), nickel (Ni), gold (Au), or platinum (Pt).

Preferably, the first metallic layer 222 includes the alloy including Ti, and the second metallic layer 223 includes the alloy including Ni. The third metallic layer 224 may include a gold layer or the alloy including Au. The total thickness of the first to third metallic layer 222, 223, and 224 can satisfy the range of about 0.45 μm to about 0.75 μm.

The first to third metallic layers 222, 223, and 224 may be formed through a thin film deposition scheme such as a sputtering scheme, an ion beam deposition scheme, and an E-beam evaporation scheme. The first to third metallic layers 222, 223, and 224 are thinly formed at a thickness of a few μm, so that fine patterns can be realized in the light emitting device package 200.

The light emitting device 250 is attached to the electrode region of the pad part 220. The light emitting device 250 is provided at a lower portion thereof with a conductive bonding layer 252, and the conductive bonding layer 252 may include conductive paste including AuSn. The conductive bonding layer 252 has a thickness of about 30 μm or less, preferably, about 25 μm or less.

The light emitting devices 250 may selectively include light emitting devices manufactured by using compound semiconductors including group III-V elements, such as AlInGaN, InGaN, GaN, GaAs, InGaP, AlInGaP, InP, and InGaAs.

In addition, each light emitting device 250 may include a blue LED chip, a yellow LED chip, a green LED chip, a red LED chip, a UV LED chip, an amber-colored LED chip, and a blue-green LED chip. If the light emitting device 250 is used for a head lamp of a vehicle, the light emitting device 250 may include a blue LED chip.

As shown in FIG. 7, the light emitting device 250 includes the conductive bonding layer 252, a bonding layer 253, a second conductive semiconductor layer 255, an active layer 257, and a first conductive semiconductor layer 259.

The conductive bonding layer 252 may include a metallic conductive semiconductor substrate or an electrical conductive semiconductor substrate.

A group III-V nitride semiconductor layer is formed on the substrate 252, and the growth equipment of a semiconductor may be selected from the group consisting of an E-beam evaporator, PVD (physical vapor deposition) equipment, CVD (chemical vapor deposition) equipment, PLD (plasma laser deposition) equipment, a dual-type thermal evaporator, a sputtering equipment, and MOCVD (metal organic chemical vapor deposition) equipment. However, the embodiment is not limited to the above growth equipment.

The bonding layer 253 may be formed on the conductive bonding layer 252. The bonding layer 253 bonds the conductive bonding layer 252 with the nitride semiconductor layer. In addition, the conductive bonding layer 252 may be formed through a plating scheme instead of a bonding scheme. In this case, the bonding layer 253 may not be formed.

The second conductive semiconductor layer 255 is formed on the bonding layer 253, and makes contact with the electrode region of the pad part 220, so that the second conductive semiconductor layer 255 is electrically connected to the electrode region of the pad part 220.

The second conductive semiconductor layer 225 includes a group III-V compound semiconductor, such as, at least selected from the group consisting of GaN, InN, AlN, InGaN, AlGaN, InAlGaN, and AlInN. The second conductive semiconductor layer 255 may be doped with second conductive dopants, and the second conductive dopants include a P type dopant, such as Mg, Zn, Ca, Sr, or Ba.

The second conductive semiconductor layer 255 may include a P type GaN layer having a predetermined thickness formed by applying gas including a P type dopant such as NH3, TMGa (or TEGa), or Mg.

The second conductive semiconductor layer 255 has a current spreading structure at a predetermined area. The current spreading structure includes semiconductor layers representing a higher current spreading speed in a horizontal direction instead of the vertical direction.

The current spreading structure may include semiconductor layers having a difference in the density of dopants or conductivity.

The second conductive semiconductor layer 255 can supply carriers, which are spread with a uniform distribution, to another upper layer, for example, the active layer 257.

The active layer 257 is formed on the second conductive semiconductor layer 255. The active layer 257 has a single quantum well structure or a multi-quantum well structure. One stack structure of the active layer 257 may selectively include an InGaN/GaN stack structure, an AlGaN/InGaN stack structure, an InGaN/InGaN stack structure, or an AlGaN/GaN stack structure.

A second conductive clad layer (not shown) may be formed between the second conductive semiconductor layer 255 and the active layer 257. The second conductive clad layer may include a P type GaN semiconductor. The second conductive clad layer may include a material having an energy bandgap higher than that of the well layer.

A first conductive semiconductor layer 259 is formed on the active layer 257. The first conductive semiconductor layer 259 may include an N type semiconductor layer doped with first conductive dopants. The N type semiconductor layer may include one of compound semiconductors such as GaN, InN, AlN, InGaN, AlGaN, InAlGaN, and AlInN. The first conductive dopant is an N type dopant, and may include at least one of Si, Ge, Sn, Se, and Te.

The first conductive semiconductor layer 255 may include an N type GaN layer formed at a predetermined thickness by supplying gas including an N type dopant such as NH3, TMGa (or TEGa), or Si.

In addition, the second conductive semiconductor layer 255 may include a P type semiconductor layer, and the first conductive semiconductor layer 259 may include an N type semiconductor layer. The light emitting structure may include one of an N-P junction structure, a P-N junction structure, an N-P-N junction structure, and a P-N-P junction structure. Hereinafter, a case in which the uppermost layer of the semiconductor layer is the first conductive semiconductor layer will be described for the illustrative purpose.

The first electrode and/or an electrode layer (not shown) may be formed on the first conductive semiconductor layer 259. The electrode layer may include an oxide or nitride-based transmissive layer, for example, may include one selected from the group consisting of ITO (indium tin oxide), ITON (indium tin oxide nitride), IZO (indium zinc oxide), IZON (indium zinc oxide nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, and NiO. The electrode layer may serve as a current diffusion layer capable of diffusing a current.

Although the light emitting device package 200 of FIGS. 1 to 7 has been described in that the vertical-type light emitting devices 250 are connected to each other in series, the vertical-type light emitting devices 250 may be connected to each other in parallel, or lateral-type light emitting devices may be connected to each other in series or in parallel.

As described above, in the light emitting module 300 shown in FIGS. 1 to 7, the insulating substrate 210 of the light emitting device package 200 includes a nitride, and the insulating substrate 210 is directly bonded to the metallic plate 110 of the circuit board 100 by using the bonding paste 271 representing high thermal conductivity, thereby ensuring heat radiation. Accordingly, the pad part 220 of the light emitting device package 200 is not formed through a patterning process for a thick copper metal layer, but formed as a metallic thin film through a sputtering process, so that a fine pattern can be formed.

Hereinafter, the light emitting module according to the second embodiment will be described with reference to FIG. 8.

Figure 8:
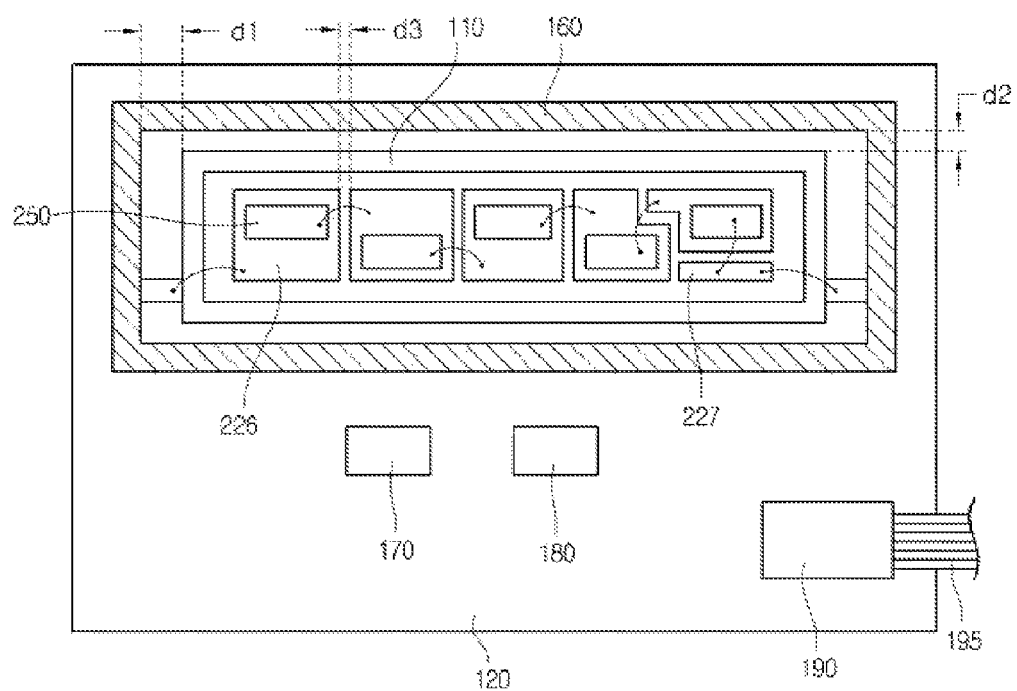
FIG. 8 is a plan view showing a light emitting module according to a second embodiment.

FIG. 8 is a plan view showing a light emitting module according to the second embodiment.

Hereinafter, when the second embodiment is described, the structures and the components identical to those of the first embodiment will not be further described in order to avoid redundancy.

Referring to FIG. 8, the circuit board 100 of the light emitting module 300 has the same structure and functions the same as those of the circuit board 100 according to the first embodiment.

The light emitting device package 200 of the light emitting module 300 includes a plurality of pad parts 226 on the insulating substrate 210.

The pad parts 226 are arranged while forming a row according to the arrangement of the light emitting devices.

The number of the pad parts 226 is equal to the number of the light emitting devices 250. When five light emitting devices 250 are provided in one row in the light emitting device package 200 as shown in FIGS. 1 to 4, five pad parts 226 are provided in one row.

The pad part 226 includes an electrode region to which the light emitting device 250 is attached and a connection region bonded to an adjacent light emitting device 250 or the pad 135 of the adjacent circuit board 100 through a wire.

In adjacent pad parts 226, an electrode region is opposite to a connection region.

In other words, as shown in FIG. 8, the electrode regions and the connection regions of the pad parts 226 are alternately arranged in opposition to each other, so that the light emitting devices 250 attached on the electrode regions may be arranged in a zig-zag pattern.

Therefore, the light emitting device 250 is far away from an adjacent light emitting device 250, so that a distance d3 between the pad parts 220 becomes narrower than that of the first embodiment. Accordingly, the fine circuit patterns can be realized.

In the last pad part 226, the connection region may protrude from the electrode region as shown in FIG. 2, and a pad island 227 separated from the electrode region may be provided.

The light emitting module 300 can serve as a light source of a head lamp for a vehicle and can represent improved light collection due to the absorption of scattered lights by the solder resist 120 and the guide protrusion 160. In addition, the metallic plate 110 is directly attached to the support substrate 210 having high thermal conductivity, thereby ensuring the heat radiation, so that the reliability can be increased.

Meanwhile, referring to FIGS. 1 and 2, the zener diode 170 and the temperature sensor 180 are formed on the solder resist 120 provided on the top surface of the metallic plate 110 of the circuit board 100.

The zener diode 170 and the temperature sensor 180 are provided outside the guide protrusion 160 as shown in FIG. 1.

Figure 9:
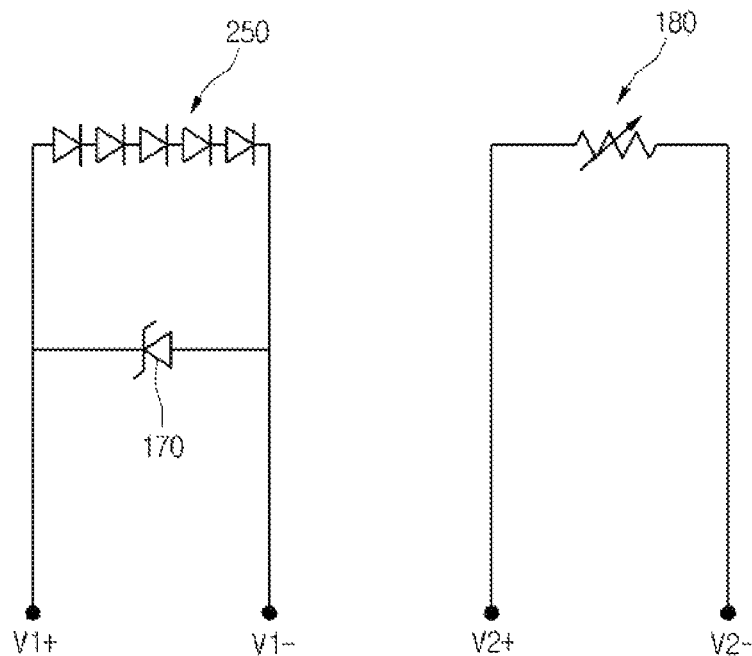
FIG. 9 is a circuit diagram showing a light emitting module according to the embodiment.

FIG. 9 is a circuit diagram showing a light emitting device, a zener diode, and a temperature sensor according to the embodiment.

Referring to FIG. 9, the zener diode 170 is connected to the light emitting devices 250 of the light emitting device package 120 in parallel, thereby preventing an inverse voltage from being applied to the light emitting device package 200.

In other words, the zener diode 170 and light emitting diodes serving as the light emitting devices 250 are connected to each other in parallel between the first positive voltage V1+ and the first negative voltage V1−.

The temperature sensor 180 may be a thermistor serving as a variable resistor having resistance varying according to the temperatures. Preferably, the temperature sensor 180 may be an NTC (negative temperature coefficient) thermistor in which resistivity is reduced with the increase of the temperature.

The temperature sensor 180 receives the second positive voltage V2+ or the second negative voltage V2−, which are different from voltages applied to the zener diode 170, through both terminals thereof, and outputs currents obtained by changing resistance according to heat emitted from the light emitting device 250.

A connector 190 is formed at the edge of the top surface of the metallic plate 110 to supply the first and second positive voltages V1+ and V2+ and the first and second negative voltages V1− and V2− to the zener diode 17 and the temperature sensor 180, respectively.

The connector 190 has one end connected to a plurality of wires 195 to receive external signals and an opposite end connected to the circuit pattern of the circuit board 100, so that voltages V1+, V2+, V1−, and V2− are applied to the zener diode 170, the temperature sensor 180, and the light emitting device package 200, and outputs a current from the temperature sensor 180 to the outside.

An external controller (not shown) detects heat emitted from the light emitting device 250 according to a current value output from the temperature sensor 180 to control the first positive voltage V1+ and the first negative voltage V1− applied to the light emitting device 250.

Differently from the circuit of FIG. 9, the temperature sensor 180 may be connected in series between the first positive voltage V1+ and the zener diode 170. As the light emitting device 250 emits heat, the resistance of the temperature sensor 180 varies, so that the voltage division may vary.

Accordingly, the voltage transmitted to the light emitting device 50 varies according to the resistance of the temperature sensor 180, so that an amount of lights emitted from the light emitting device 250 can be controlled.

The temperature sensor 180 may be formed in the vicinity of the cavity 150 in which the light emitting device package 200 is formed, and the distance from the cavity 150 to the temperature sensor 180 is about 5 mm or less.

Hereinafter, various embodiments in which the temperature sensor 180 is arranged in the vicinity of the light emitting device package 200 will be described.

Figure 10:
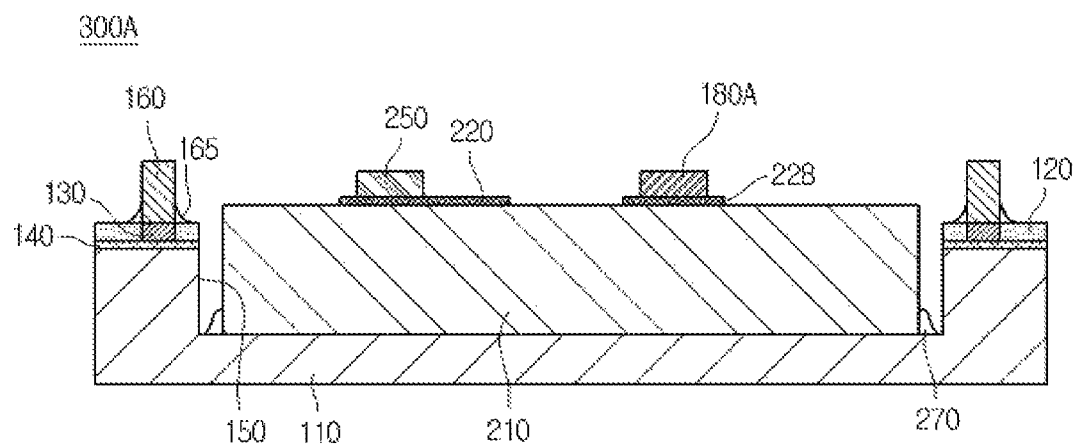
FIG. 10 is a sectional view showing a light emitting module according to a third embodiment.

FIG. 10 is a sectional view showing a light emitting module according to the third embodiment.

Hereinafter, when the third embodiment is described, the structures and the components identical to those of the first embodiment will not be further described in order to avoid redundancy.

Referring to FIG. 10, the circuit board 100 of a light emitting module 300A has the structure the same as that of the circuit board 100 according to the first embodiment, and the light emitting device package 200 has the structure the same as that of the light emitting device package 200 according to the first embodiment.

In other words, the circuit board 100 includes the metallic plate 110, the insulating layer 140, the guide pattern 130, the pad 135, and the solder resist 120 to cover the insulating layer 140.

The metallic plate 110 is provided therein with the cavity 150 having a predetermined depth from a top surface thereof.

The cavity 150 is a mounting part to mount the light emitting device package 200 therein, and has an area wider than that of the light emitting device package 200, so that a space is formed between the inner lateral surface of the cavity 150 and the light emitting device package 200.

The solder resist 120 is coated with on the whole surface of the circuit board 100 and is dark-colored to represent low transmittance and low reflectance, so that the light collection can be improved by absorbing scattered lights.

The guide patterns 130 are provided thereon with guide protrusions 160 surrounding the cavity 150. The guide protrusions 160 connect the two guide patterns 130, which are separated from each other, to each other to form a closed loop.

The light emitting device package 200 includes an insulating substrate 210, a plurality of pad parts 220 formed on the insulating substrate 210, and a plurality of light emitting devices 250 attached to the pad parts 220. In this case, a temperature sensor 180A is attached to the insulating substrate 210 of the light emitting device package 200. The temperature sensor 180A is attached to a sensor pad 228 electrically isolated from the pad part 220.

The temperature sensor 180A may be a thermistor serving as a variable resistor having resistance varying according to the temperatures. Preferably, the temperature sensor 180A may be an NTC (negative temperature coefficient) thermistor in which resistivity is reduced with the increase of the temperature.

The electrical connection between the temperature sensor 180A and the light emitting device 250 is the same as that of FIG. 8.

In this case, in order to exactly detect the temperature variation according the heat emission from the light emitting device 250, the temperature sensor 180A is mounted on the insulating substrate 210 on that the light emitting device 250 is mounted, so that the temperature sensor 180A is arranged in the vicinity of the light emitting device 250.

On end of the temperature sensor 180A may be electrically connected to the sensor pad 228 and an opposite end of the temperature sensor 180A may be connected to the pad of the circuit board 100 through a wire. In addition, the temperature sensor 180A may be insulated from the sensor pad 228, and both ends of the temperature sensor 180A may be connected to the pad of the circuit board 100 through the wire.

The sensor pad 228 may include a plurality of thin film metallic layers similarly to the pad part 220.

Figure 11:
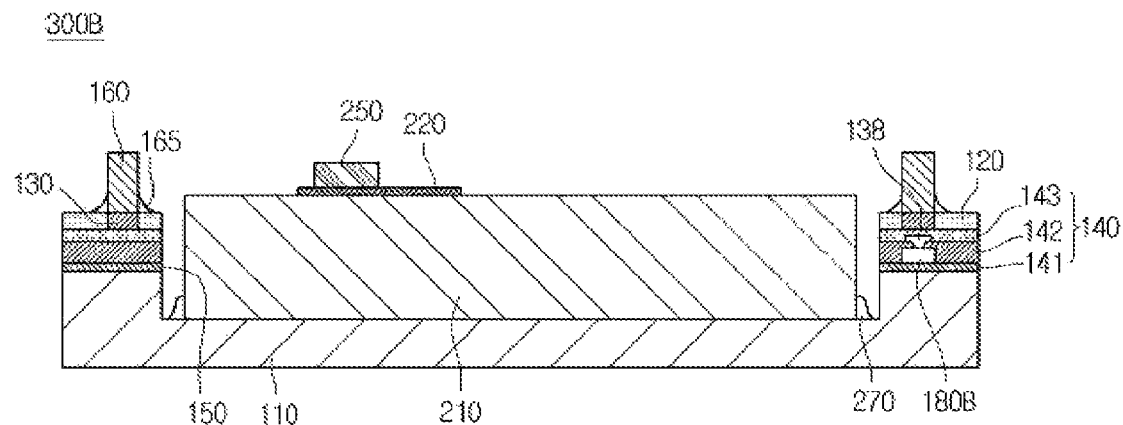
FIG. 11 is a sectional view showing a light emitting module according to a fourth embodiment.

The temperature sensor 180A on the insulating substrate 210 receives the second positive and negative voltages V2+ and V2− different from voltages applied to the zener diode 170 and varies a resistance value according to the heat emitted from the light emitting device 250, so that a changed output current flows FIG. 11 is a sectional view showing a light emitting module according to a fourth embodiment.

Hereinafter, when the fourth embodiment is described, the structures and the components identical to those of the first embodiment will not be further described in order to avoid redundancy.

Referring to FIG. 11, the circuit board 100 of a light emitting module 300B includes the metallic plate 110, the insulating layer 140, the guide pattern 130, and the solder resist 120 to cover the insulating layer 140.

The metallic plate 110 is provided therein with the cavity 150 having a predetermined depth from a top surface thereof.

The cavity 150 is a mounting part to mount the light emitting device package 200 therein, and has an area wider than that of the light emitting device package 200, so that a space is formed between the inner lateral surface of the cavity 150 and the light emitting device package 200.

The insulating layer 140 is filled with a temperature sensor 180B.

The insulating layer 140 includes a plurality of first to third insulating layers 141, 142, and 143, and the temperature sensor 180B is buried in the insulating layers 141, 142, and 143.

In detail, the first to third insulating layers 141 is provided on the metallic plate 110, and the temperature sensor 180B is formed on the first insulating layer 141.

The second insulating layer 142 is formed on the first insulating layer 141 while burying the temperature sensor 180B therein, and a circuit pattern 138 connected to the temperature sensor 180B is formed on the second insulating layer 142.

The circuit pattern 138 is electrically connected to the temperature sensor 180B through a via formed in the second insulating layer 142 to receive the second position and negative voltages V2+ and V2−.

The third insulating layer 143 is formed on the second insulating layer 142 to cover the circuit pattern 138, and the solder resist 120 is formed on the third insulating layer 143.

Although the insulating layer 140 has been described in that the insulating layer 140 includes three layers of the first to third insulating layers 141, 142, and 143, the insulating layer 140 naturally includes a plurality of layers according to the circuit design.

In this case, the temperature sensor 180B may be buried in the upper insulating layer of the first to third insulating layers 141, 142, and 143 so that the temperature sensor 180B is provided closely to the light emitting device 250. The temperature sensor 180B is formed at the lower portion of the guide protrusion 160 or the inward from the guide protrusion 160, so that the temperature sensor 180B may be provided closely to the cavity 150.

Figure 12:
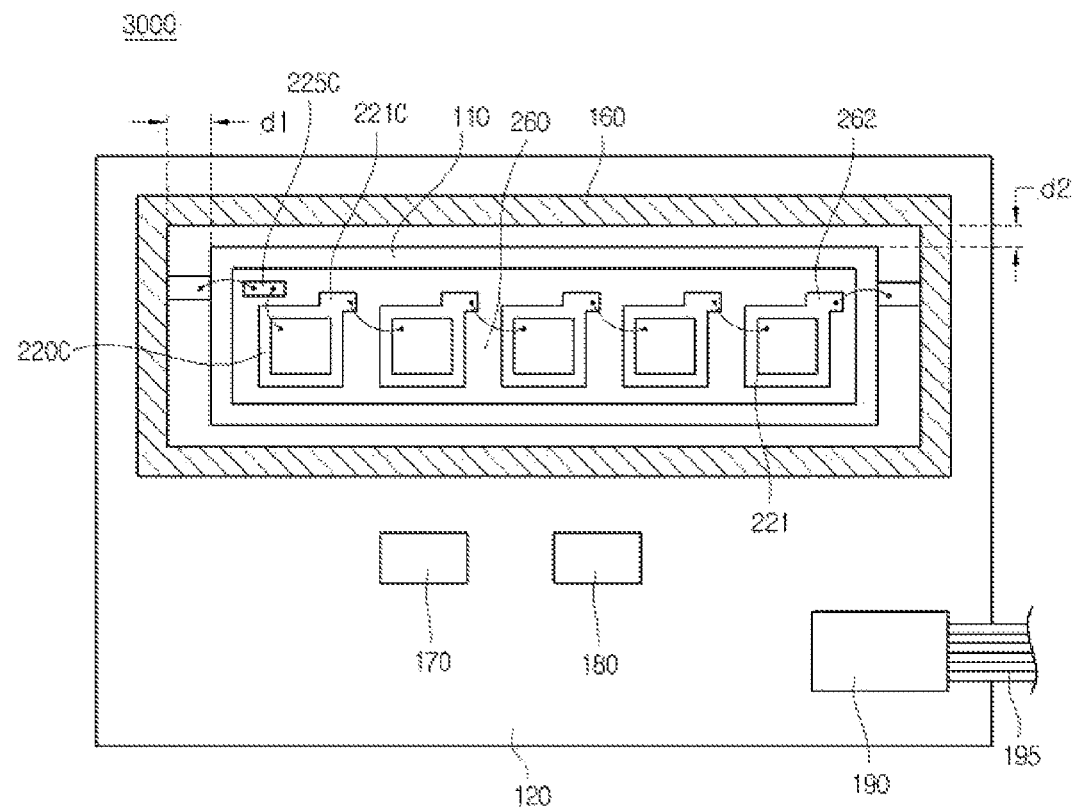
FIG. 12 is a sectional view showing a light emitting module according to a fifth embodiment.

FIG. 12 is a sectional view showing a light emitting module 300C according to the fifth embodiment.

Referring to FIG. 12, when the fifth embodiment is described, the structures and the components identical to those of the first embodiment will not be further described in order to avoid redundancy.

Referring to FIG. 12, the circuit board 100 of the light emitting module 300C has the structure the same as that of the circuit board 100 according to the first embodiment.

In other words, the circuit board 100 includes the metallic plate 110, the insulating layer 140, the guide pattern 130, the pad 135, and the solder resist 120 to cover the insulating layer 140.

The metallic plate 110 is provided therein with the cavity 150 having a predetermined depth from the top surface of the metallic plate 110, and the light emitting device package 200 is attached to the inside of the cavity 150.

The guide protrusions 160 surround the cavity 150 on the metallic plate 110, and the zener diode 170 and the temperature sensor 180 are provided outside the guide protrusions 160.

The light emitting device package 200 includes the insulating substrate 210, a plurality of pad parts 220C formed on the insulating substrate 210, and a plurality of light emitting devices 250 attached to the pad part 220C.

The pad parts 220C are formed on the top surface of the insulating substrate 210.

The pad parts 220C may be arranged while forming a row according to the arrangement of the light emitting device 250.

The pad part 220C includes an electrode region attached to the light emitting device 250 and a connection region 221C bonded to an adjacent light emitting device 250 or the pad 135 of the circuit board 100 through a wire.

The electrode region may have a rectangular shape according to the shape of the region of the light emitting device 250, and the connection region 221C extends from the electrode region to protrude toward the adjacent pad part 220C.

Each light emitting device 250 is attached to the electrode region of the pad part 220C.

The light emitting device 250 is a vertical-type light emitting diode, and has one end attached to the pad 220C and an opposite end bonded to the connection region 221C of the adjacent pad part 220 through the wire 260, so that the light emitting devices 250 may be connected to each other in series.

When the light emitting devices 250 are connected to each other in series as described, the light emitting device package 200 is provided on the top surface thereof with a pad island 225C including only the connection region 221C in adjacent to the pad part 220C attached to the first light emitting device 250.

The connection region 221C of the pad part 220C provided in the last column is connected to the pad 135 of the adjacent circuit board 100 through the wire 262.

In this case, in the pad part 220C and the pad island 225C, the electrode region of the pad part 220C is provided toward the temperature sensor 180 so that the light emitting device 250 is close to the temperature sensor 180, and the connection region 221C is provided in a direction opposite to the direction of the temperature sensor 180.

Differently from FIGS. 1 and 2, the light emitting device 250 is provided toward the temperature sensor 180, so that the temperature sensor 180 of the circuit board 100 is close to the light emitting device 250. Accordingly, the detection performance of the temperature sensor 180 can be improved.

Hereinafter, a light emitting module according to the sixth embodiment will be described with reference to FIGS. 13 and 14.

Figure 13:
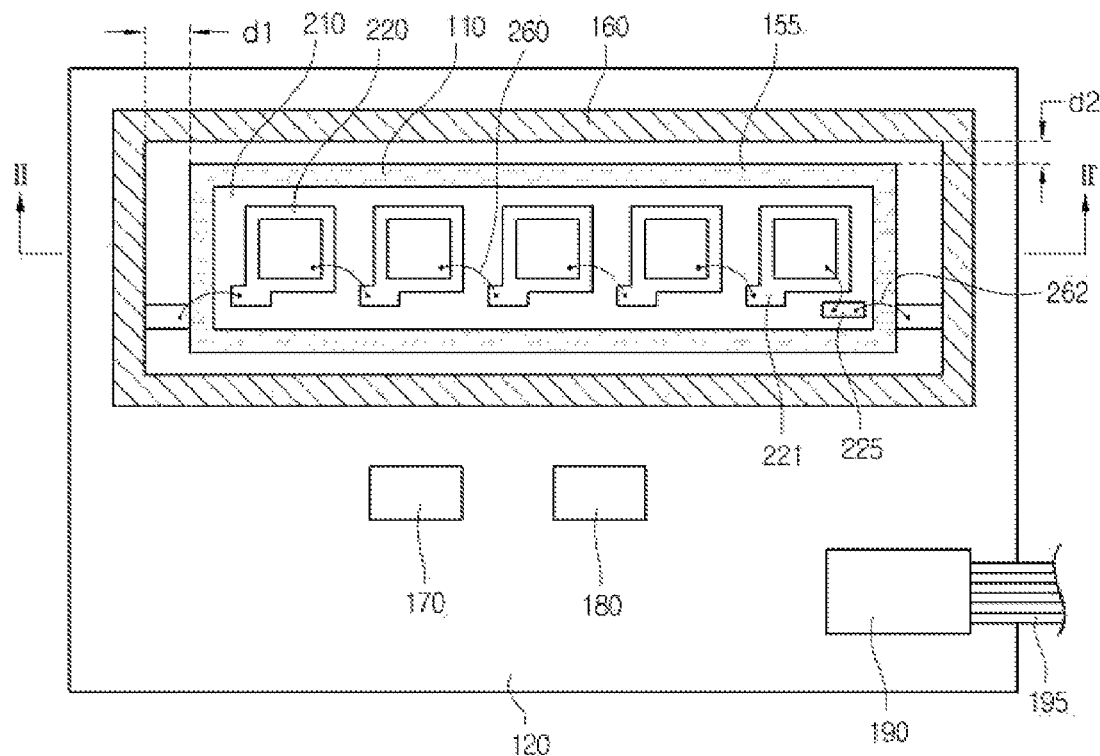
FIG. 13 is a plan view showing a light emitting module according to a sixth embodiment.
Figure 14:
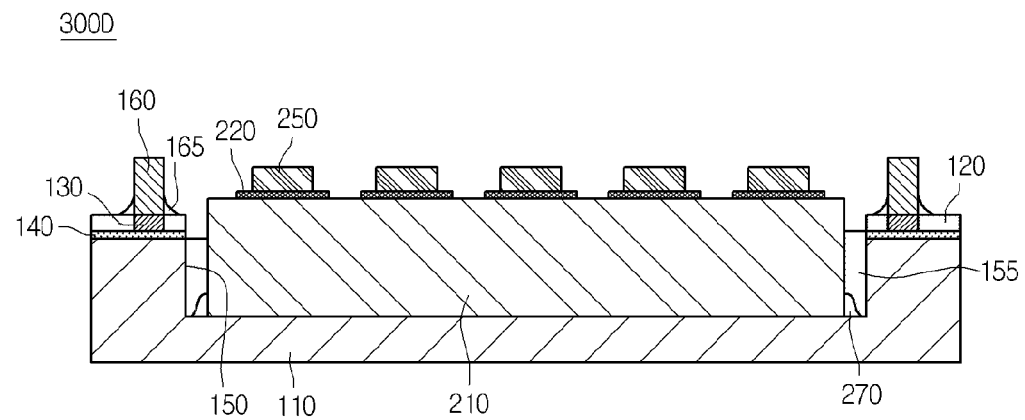
FIG. 14 is a sectional view showing a light emitting module of FIG. 13 taken along line III-III'.

FIG. 13 is a plan view showing a light emitting module according to a sixth embodiment, and FIG. 14 is a sectional view showing the light emitting module of FIG. 13 taken along line III-III'.

Hereinafter, when the sixth embodiment is described, the structures and the components identical to those of the first embodiment will not be further described in order to avoid redundancy.

Referring to FIGS. 13 and 14, the circuit board 100 of a light emitting module 300D has the structure the same as that of the circuit board 100 according to the first embodiment, and the light emitting device package 200 has the structure the same as that of the light emitting device package 200 according to the first embodiment.

In other words, the circuit board 100 includes the metallic plate 110, the insulating layer 140, the guide pattern 130, the pad 135, and the solder resist 120 to cover the insulating layer 140.

The metallic plate 110 is provided therein with the cavity 150 having a predetermined depth from a top surface thereof.

The cavity 150 is a mounting part to mount the light emitting device package 200 therein, and has an area wider than that of the light emitting device package 200, so that a space is formed between the inner lateral surface of the cavity 150 and the light emitting device package 200.

The solder resist 120 is coated with on the whole surface of the circuit board 100 and is dark-colored to represent low transmittance and low reflectance, so that the light collection can be improved by absorbing scattered lights.

The guide patterns 130 are provided thereon with the guide protrusions 160 surrounding the cavity 150. The guide protrusions 160 connect the two guide patterns 130, which are separated from each other, to each other to form a closed loop.

The guide protrusion 160 may include an insulating inorganic material, or may include a non-transmittance material.

The light emitting device package 200 includes an insulating substrate 210, a plurality of pad parts 220 formed on the insulating substrate 210, and a plurality of light emitting devices 250 attached to the pad parts 220.

The insulating substrate 210 has a rectangular parallelepiped shape having a sectional area smaller than that of a bottom surface of the cavity 150 so that the insulating substrate 210 may be installed in the cavity 150.

The insulating substrate 210 includes a nitride substrate representing high thermal conductivity, preferably, an aluminum nitride substrate. The insulating substrate may have a thermal conductivity of about 170 Kcal/m·h·°C. or more. The nitride insulating substrate 210 may have a thickness of about 300 μm or more, preferably, the thickness of about 350 μm or more. The insulating substrate 210 has a thickness greater than the depth of the cavity 150, so that the insulating substrate 210 may protrude from the cavity 150.

The insulating substrate 210 may be attached to the cavity 150 by the bonding paste 271 representing a high thermal conductivity and coated on the bottom surface of the cavity 150 as shown in FIG. 6. The bonding paste 271 may include a conductive paste including AuSn.

The bonding paste 271 is thinly spread on the bottom surface of the insulating substrate 210 through heat and temperature, and the fillet 270 is formed to surround a portion of the lateral surface of the insulating substrate 210 to support the insulating substrate 210.

A lateral-surface heat radiation member 155 is formed in the space between the insulating substrate 210 and the lateral surface of the cavity 150 as shown in FIGS. 8 and 9.

The lateral-surface heat radiation member 155 connects the lateral surface of the cavity 150 to the lateral surface of the insulating substrate 210. The lateral-surface heat radiation member 155 includes a material representing high thermal conductivity, preferably, a metal representing thermal conductivity higher than that of the insulating substrate 210.

For example, the lateral-surface heat radiation member 155 may include the alloy including Cu, Ag, Au, or Al, may be formed by coating a paste including alloy powder, or may be formed by filling alloy coin into the space.

As described above, the lateral-surface heat radiation member 155 is formed on the bonding paste 271 attaching the insulating substrate 210 to the metallic plate 110 in the state that the insulating substrate 210 is attached to the metallic plate 110, so that the fillet 270 of the bonding paste 271 is pressed. Accordingly, the insulating substrate 210 can be firmly attached to the metallic plate 110.

The lateral-surface heat radiation member 155 including a metal representing superior heat conductivity, so that heat emitted from the light emitting device package 200 can be discharged through the lateral surface of the insulating substrate 210 as well as the lower portion of the insulating substrate 210. Accordingly, the heat radiation can be improved.

Hereinafter, a light emitting module 300E according to a seventh embodiment will be described with reference to FIG. 15.

Figure 15:
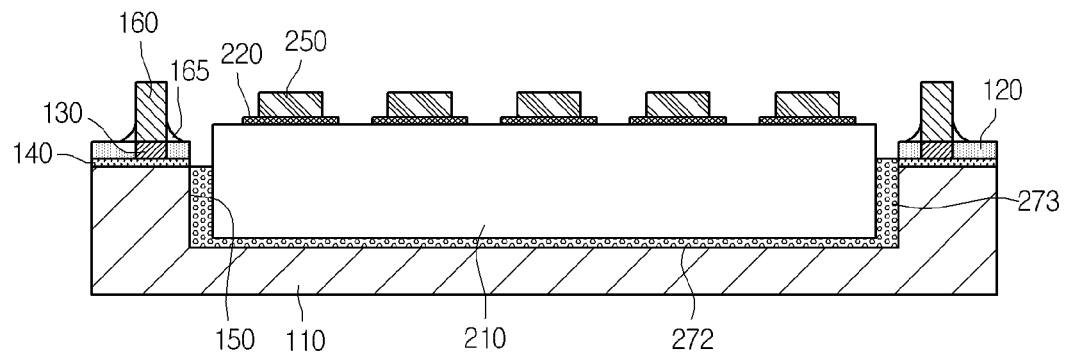
FIG. 15 is a sectional view showing a light emitting module according to a seventh embodiment.

Since the light emitting module 300E according to the seventh embodiment of FIG. 15 has the same structure as that of the light emitting module 300A of FIG. 14, the description about the detailed structure of the light emitting module 300E may be omitted.

The light emitting module 300E of FIG. 15 includes a lateral-surface heat radiation member 273 provided in a space between the lateral surface of the cavity 150 of the circuit board 100 and the lateral surface of the insulating substrate 210.

The lateral-surface heat radiation member 273 extends from the bonding paste 272 bonding the insulating substrate 210 to the circuit board 100.

The bonding paste 272 includes alloy particles including Ag, Au, Al, or Cu, or an inorganic material, such as silicon, representing high thermal conductivity. In the light emitting module 300B, the bonding paste 272 is excessively coated on the bottom surface of the cavity 150, and the light emitting device package 200 is attached to the bonding paste 272 while the light emitting device package 200 is being pressed. Accordingly, the bonding paste 272 of the bottom surface of the cavity 150 is filled in the space between the lateral surface of the cavity 150 and the lateral surface of the insulating substrate 210 due to the pressing of the light emitting device package 200.

Accordingly, the lateral-surface heat radiation member 273 extending from the bonding paste 272 is formed in the space. The lateral-surface heat radiation member 273 may be formed through the bonding process between the circuit board 100 and the light emitting device package 200 without filling or coating an additional metallic member.

Therefore, heat emitted from the light emitting device package 200 is transferred to the metallic plate 110 of the circuit board 100 through the bottom surface of the insulating substrate 210 and the lateral surface of the insulating substrate 210, so that heat radiation can be improved.

Meanwhile, the light emitting module 300E may include a molding member to cover the cavity 150 of the circuit board 100.

Hereinafter, various applications of the molding part according to the embodiment will be described with reference to FIGS. 16 to 20.

Figure 16:
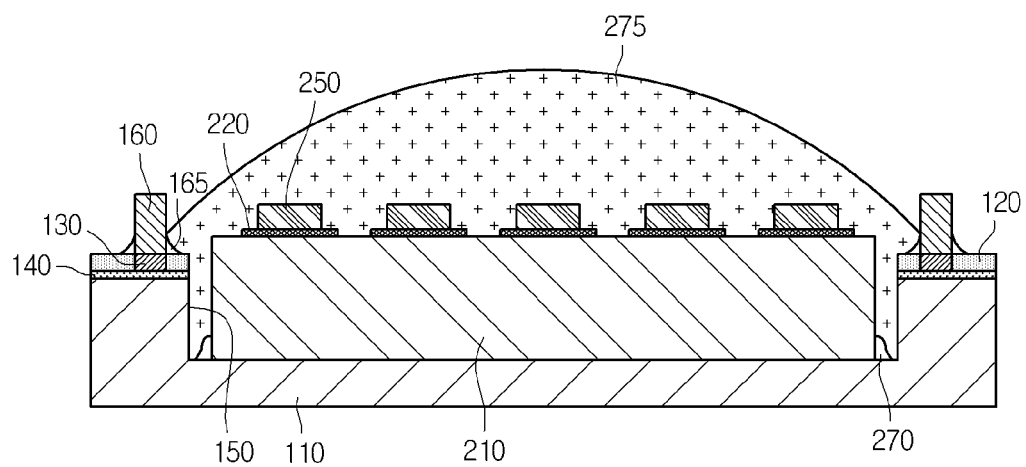
FIG. 16 is a sectional view showing a first application for a molding part according to the embodiment.

A light emitting module 300F of FIG. 16 includes a molding part 275, which is filled in the cavity 150, with the light emitting module 300 shown in FIGS. 1 to 8.

The molding part 275 protects the light emitting device package 200 in the cavity 150 and includes a transparent resin material to discharge a light emitted from the light emitting device 250. The molding part 275 may include a plurality of resin layers having different refractive indexes.

The molding part 275 is curved outward so that the molding part 275 has an upper surface in the shape of a convex lens.

The molding part 275 may be formed inward from the guide protrusions 160 of the circuit board 100, and the guide protrusions 160 can guide the position of the molding part 275.

The molding part 275 may include a transparent resin material such as silicon or epoxy. At least one kind of phosphor may be contained in the resin material of the molding part 275. The phosphor may include a yellow phosphor or both the yellow phosphor and a red phosphor.

Figure 17:
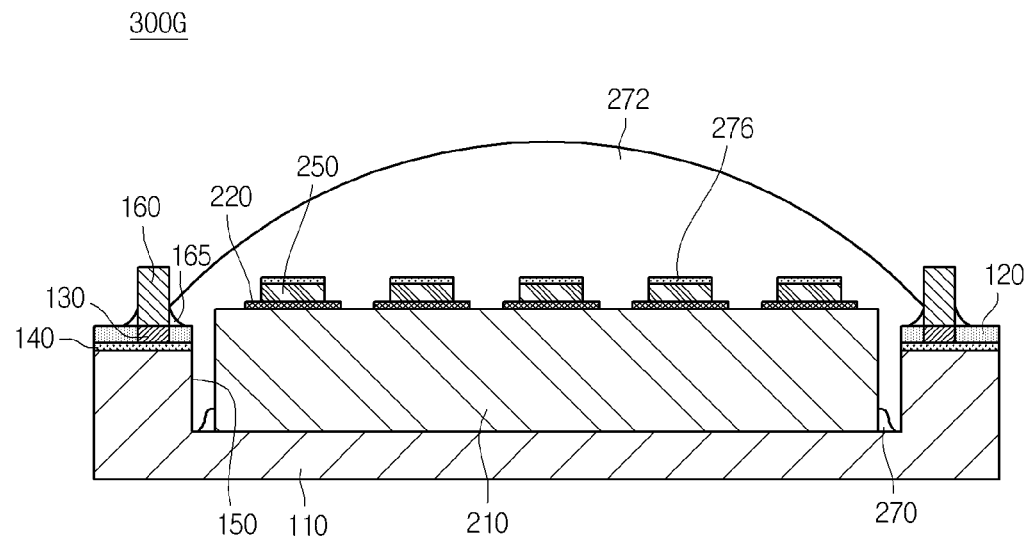
FIG. 17 is a sectional view showing a second application for a molding part according to the embodiment.

The light emitting module 300G of FIG. 17 includes a convex-type molding part 272 similarly to the structure of FIG. 16, and a phosphor layer 276 may be formed on the light emitting device 250.

In other words, the phosphor layer 276 is formed by coating a resin material including the phosphor on the uppermost layer of the light emitting device 250, so that the light emitting color can be adjusted.

In this case, the molding part 272 is formed inward from the guide protrusion 160, so that the molding part 272 may be guided by the guide protrusion 160.

Figure 18:
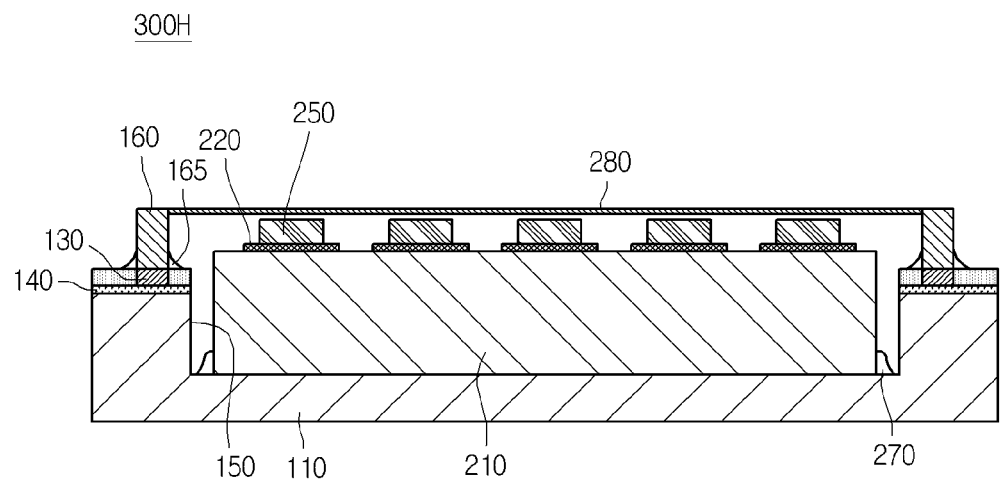
FIG. 18 is a sectional view showing a third application for a molding part according to the embodiment.

Meanwhile, a light emitting module 300H of FIG. 18 includes a film-type molding part 280 supported to the guide protrusions 160 to cover the cavity 150.

Differently from the molding part of FIGS. 16 and 17, the molding part 280 is not filled in the cavity 150, but covers the upper portion of the cavity 150 so that an air gap is formed in the cavity 150, thereby sealing the inner part of the cavity 150.

The molding part 280 may include a film including a transparent resin material, and may include a phosphor layer as shown in FIG. 16.

Figure 19:
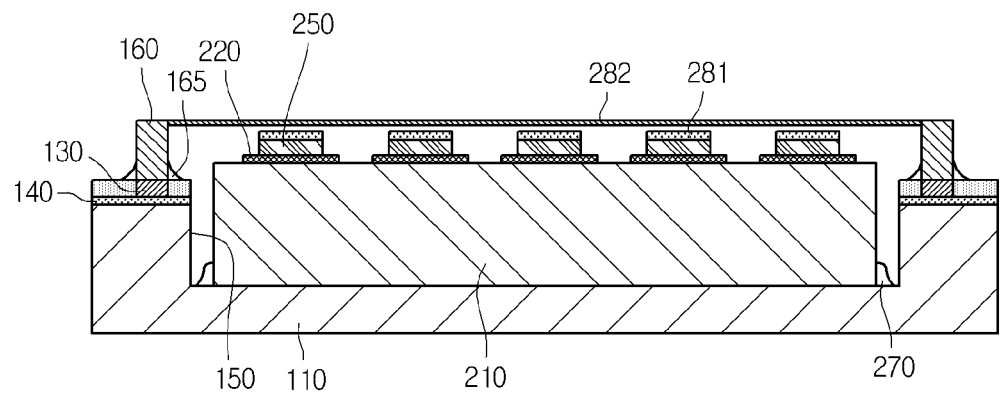
FIG. 19 is a sectional view showing a fourth application for a molding part according to the embodiment.

Meanwhile, similarly to a light emitting module 300I of FIG. 19, the molding part 282 has the form of a film including a transparent resin material, and a phosphor layer 281 is coated on the uppermost layer of the light emitting device 250.

Figure 20:
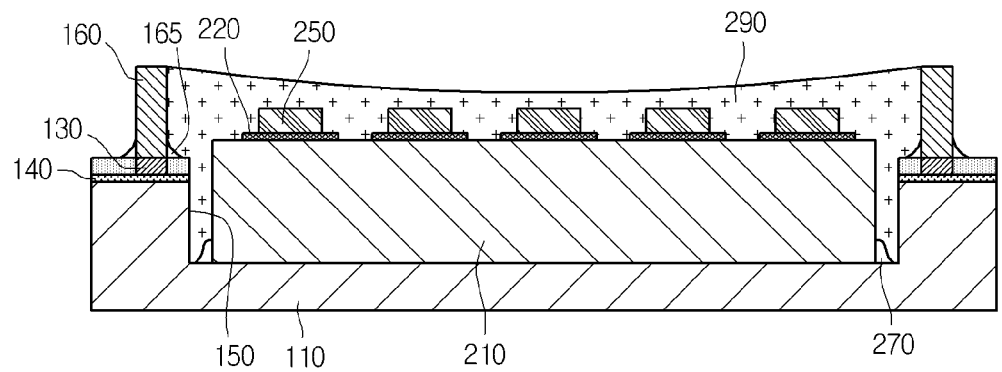
FIG. 20 is a sectional view showing a fifth application for a molding part according to the embodiment.

Meanwhile, in a light emitting module 300J of FIG. 20, a molding part 290 extends from the top surface of the guide protrusion 160 so that the molding part 290 is filled in the cavity 150.

The top surface of the molding part 290 is curved in a concave pattern toward the light emitting device 250, and a phosphor may be contained in the molding part 290 or may be coated on the uppermost layer of the light emitting device 250.

As shown in FIGS. 16 to 20, the molding parts 275, 272, 280, 282, and 290 may have various modifications.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module, comprising:
a metallic plate formed therein with a cavity;
an insulating layer on the metallic plate;
a guide protrusion surrounding the cavity on the metallic plate;
a nitride insulating substrate on the cavity;
a plurality of light emitting devices on the nitride insulating substrate;

a bonding layer between the nitride insulating substrate and the light emitting devices;

a fillet surrounding the nitride insulating substrate;

a substrate pad electrically connected to at least one of the light emitting devices on the insulating layer; and a solder resist exposing the substrate pad on the insulating layer, wherein the nitride insulating substrate has a thickness greater than a depth of the cavity, wherein the fillet is provided in the cavity and supporting the nitride insulating substrate, and wherein the guide protrusion includes a non-transmissive inorganic material.

2. The light emitting module of claim 1, wherein the substrate pad is exposed on the metallic plate between the cavity and the guide protrusion.

3. The light emitting module of claim 1, wherein a distance between the guide protrusion, which is formed at a side where the substrate pad is exposed, and the cavity is greater than a distance between the guide protrusion, which is formed at a side where the substrate pad is absent, and the cavity.

4. The light emitting module of claim 1, further comprising:

a plurality of pads between the nitride insulating substrate and the corresponding light emitting devices, each pad of the plurality of pads comprising at least two metallic layers, wherein an uppermost layer of the at least two metallic layers includes gold or an alloy layer including gold.

5. The light emitting module of claim 4, wherein a total thickness of the at least two metallic layers is in a range of about 0.45 μm to about 0.75 μm.

6. The light emitting module of claim 1, further comprising a temperature sensor electrically isolated from the light emitting devices and representing resistance varying by heat emitted from the light emitting devices.

7. The light emitting module of claim 6, wherein the temperature sensor is provided within a distance of about 5 mm or less from the cavity.

8. The light emitting module of claim 6, wherein the temperature sensor is mounted on the metallic plate.

9. The light emitting module of claim 8, wherein the temperature sensor is buried in the insulating layer, and the temperature sensor buried in the insulating layer is provided inward of the guide protrusion.

10. The light emitting module of claim 4, wherein each pad of the plurality of pads comprises:

an electrode region to which the corresponding light emitting device is attached; and a connection region protruding from the electrode region and subject to a wire bonding.

11. The light emitting module of claim 1, further comprising a lateral heat radiation member formed in a space between an outer wall of the nitride insulating substrate and an inner wall of the metallic plate.

12. The light emitting module of claim 11, wherein the heat radiation member includes an alloy representing thermal conductivity higher than thermal conductivity of the nitride insulating substrate.

13. The light emitting module of claim 11, further comprising:

a bonding paste between the nitride insulating substrate and the metallic plate.

14. The light emitting module of claim 13, wherein the bonding paste comprises a conductive paste.

15. The light emitting module of claim 14, wherein the conductive paste comprises AuSn.

16. The light emitting module of claim 1, wherein the fillet is disposed at an edge of a region where the nitride insulating substrate and the metallic plate contact.

17. The light emitting module of claim 1, wherein the nitride insulating substrate comprises AN.

18. The light emitting module of claim 1, wherein the bonding layer comprises AuSn.

19. The light emitting module of claim 1, further comprising:

a phosphor disposed on at least one of the light emitting devices.

20. The light emitting module of claim 19, further comprising:

a molding part disposed on the phosphor.

21. The light emitting module of claim 20, wherein the molding part includes a transparent resin material.

22. The light emitting module of claim 21, wherein the transparent resin material includes silicon or epoxy.

23. The light emitting module of claim 1, further comprising:

a zener diode on the solder resist.

24. A light emitting module, comprising:

a metallic plate formed therein with a cavity;

a nitride insulating substrate on the cavity;

a plurality of light emitting devices on the nitride insulating substrate;

a bonding layer between the nitride insulating substrate and the light emitting device;

a fillet surrounding the nitride insulating substrate;

a temperature sensor electrically isolated from the light emitting devices and representing a resistance varying by heat emitted from the light emitting devices; and a plurality of pads between the nitride insulating substrate and the corresponding light emitting devices, each pad of the plurality of pads comprising at least two metallic layers, wherein an uppermost layer of the at least two metallic layers includes gold or an alloy layer including gold, each pad of the plurality of pads comprises an electrode region to which the corresponding light emitting device is attached, and a connection region protruding from the electrode region and subject to a wire bonding, and the electrode region of the pad is directed toward the temperature sensor, wherein the nitride insulating substrate has a thickness greater than a depth of the cavity, and wherein the fillet is provided in the cavity and supporting the nitride insulating substrate.

25. A light emitting module, comprising:

a metallic plate formed therein with a cavity;

a nitride insulating substrate on the cavity;

a plurality of light emitting devices on the nitride insulating substrate;

a bonding layer between the nitride insulating substrate and the light emitting device;

a fillet surrounding the nitride insulating substrate; and a lateral heat radiation member formed in a space between an outer wall of the nitride insulating substrate and an inner wall of the metallic plate, wherein the nitride insulating substrate has a thickness greater than a depth of the cavity, wherein the fillet is provided in the cavity and supporting the nitride insulating substrate, and wherein the heat radiation member includes an alloy including silver (Ag), gold (Au), copper (Cu), aluminum (Al) or an alloy representing thermal conductivity higher than thermal conductivity of the nitride insulating substrate.

\* \* \* \* \*